US009318163B2

(12) United States Patent
Eguchi et al.

(10) Patent No.: US 9,318,163 B2
(45) Date of Patent: Apr. 19, 2016

(54) ROBUST MEMORY START-UP USING CLOCK COUNTER

(71) Applicants: Richard K. Eguchi, Austin, TX (US); Craig D. Gunderson, Round Rock, TX (US)

(72) Inventors: Richard K. Eguchi, Austin, TX (US); Craig D. Gunderson, Round Rock, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 202 days.

(21) Appl. No.: 13/789,017

(22) Filed: Mar. 7, 2013

(65) Prior Publication Data

US 2014/0254299 A1 Sep. 11, 2014

(51) Int. Cl.
*G11C 7/20* (2006.01)
*G11C 5/14* (2006.01)
*G11C 7/22* (2006.01)

(52) U.S. Cl.
CPC ........ *G11C 5/148* (2013.01); *G11C 7/20* (2013.01); *G11C 7/22* (2013.01)

(58) Field of Classification Search
CPC ............ H03D 9/00; H03L 7/06; G11C 5/148; G11C 7/20; G11C 7/22; G11C 29/00; G11C 29/04
USPC ........ 365/226, 189, 230, 233; 327/10; 331/18
See application file for complete search history.

(56) References Cited

U.S. PATENT DOCUMENTS

| 6,166,960 | A | 12/2000 | Marneweck et al. |
| 6,424,570 | B1 | 7/2002 | Le et al. |
| 6,642,757 | B2 | 11/2003 | Ikehashi et al. |
| 6,774,710 | B2 | 8/2004 | Li |
| 6,937,517 | B2 | 8/2005 | Pekny et al. |
| 7,418,604 | B2 | 8/2008 | Bliley et al. |
| 7,772,910 | B2 | 8/2010 | Lee et al. |
| 2008/0030235 | A1* | 2/2008 | Sun et al. ......................... 327/10 |
| 2010/0097149 | A1* | 4/2010 | Yeung et al. .................... 331/18 |
| 2014/0084936 | A1 | 3/2014 | Pan et al. |

OTHER PUBLICATIONS

U.S. Appl. No. 13/679,515, filed Nov. 16, 2012, entitled "Non-Volatile Memory Rubust Start-Up Using Analog-to-Digital Converter".
Non-Final Office Action mailed Jan. 16, 2015 for U.S. Appl. No. 13/679,515, 15 pages.
Final Office Action mailed Aug. 25, 2015 for U.S. Appl. No. 13/679,515, 14 pages.

* cited by examiner

*Primary Examiner* — Huan Hoang
*Assistant Examiner* — Muna A Techane (57) ABSTRACT

In accordance with at least one embodiment, a clock counter on a system (for example, a system-on-a-chip (SOC) or other system) is utilized to count a number of a clock edges of a memory clock within a predefined time based on a predetermined system clock frequency and, therefore, to determine whether the memory clock for a memory array (for example, a non-volatile memory (NVM) array or other memory array) is correct or not. The system is directed to wait until the count is within an expected range before moving to the next step in a start-up procedure. If the maximum allowed start-up time is exceeded, an error signal is sent to the system such that the application can react to it.

20 Claims, 5 Drawing Sheets

ROBUST MEMORY START-UP USING CLOCK COUNTER

CROSS-REFERENCE TO RELATED APPLICATION

The present application is related to co-pending U.S. patent application Ser. No. 13/679,515, entitled "NON-VOLATILE MEMORY ROBUST START-UP USING ANALOG-TO-DIGITAL CONVERTER," filed on Nov. 16, 2012, the entirety of which is herein incorporated by reference.

BACKGROUND OF THE INVENTION

1. Field of the Invention

This disclosure relates generally to electronic devices and, more specifically, to electronic devices having memory.

2. Description of the Related Art

Firmware or operational parameters used to control operation of a system may be stored in non-volatile memory (NVM) and loaded from the NVM to prepare a system for operation. The system may not operate properly if the configuration information stored in the NVM is not retrieved properly during a system start-up process, such as when transient fault conditions or other errors during the startup process cause the NVM to provide incorrect information at the expected time. Such lack of coordination of the memory operation with operation of the rest of the system can cause the system to attempt to operate with erroneous configuration information and to fail.

BRIEF DESCRIPTION OF THE SEVERAL VIEWS OF THE DRAWINGS

The present invention may be better understood, and its features made apparent to those skilled in the art by referencing the accompanying drawings.

The use of the same reference symbols in different drawings indicates similar or identical items.

DETAILED DESCRIPTION OF THE INVENTION

In accordance with at least one embodiment, a clock counter of an integrated circuit, such as a system, is utilized to count a number of a clock edges of a memory clock (for example, a non-volatile memory (NVM) clock or another memory clock) within a predefined time based on a predetermined second clock frequency and, therefore, to determine whether the memory clock for a memory array (for example, a non-volatile memory (NVM) array or another memory array) is within a specified parameter range. The system (for example, a system-on-a-chip (SOC) or another system) is directed to wait until the count is within an expected range before moving to the next step in a start-up procedure involving the NVM. If a maximum allowed start-up time is exceeded without the NVM clock for the NVM operating within the specified parameter range, an error signal is sent to the system such that the application can react to it.

A memory clock is used by a memory array to provide proper timing and voltage relationships to perform memory operations, such as memory read, erase, and program operations. Having the memory clock operating properly assists in assuring proper performance for start-up, read, erase, and program operations of the memory array. Proper NVM clock performance assures proper access of NVM memory cells that store parameter values that are used to further configure the NVM for normal operation. Proper access of such NVM memory cells allows configuration information, such as parameter values, to be properly retrieved during a system start-up process even when transient fault conditions or other errors occurring during the start-up process would otherwise cause the NVM to provide incorrect information at the expected time. Accordingly, assurance of proper NVM clock operation can avoid adverse consequences on system operation. By assuring coordination of the memory operation with operation of the rest of the system, the system can be assured to operate with valid configuration information to avoid failure. Thus, system reliability can be enhanced by assuring proper NVM clock performance, in accordance with at least one embodiment.

Figure 1:
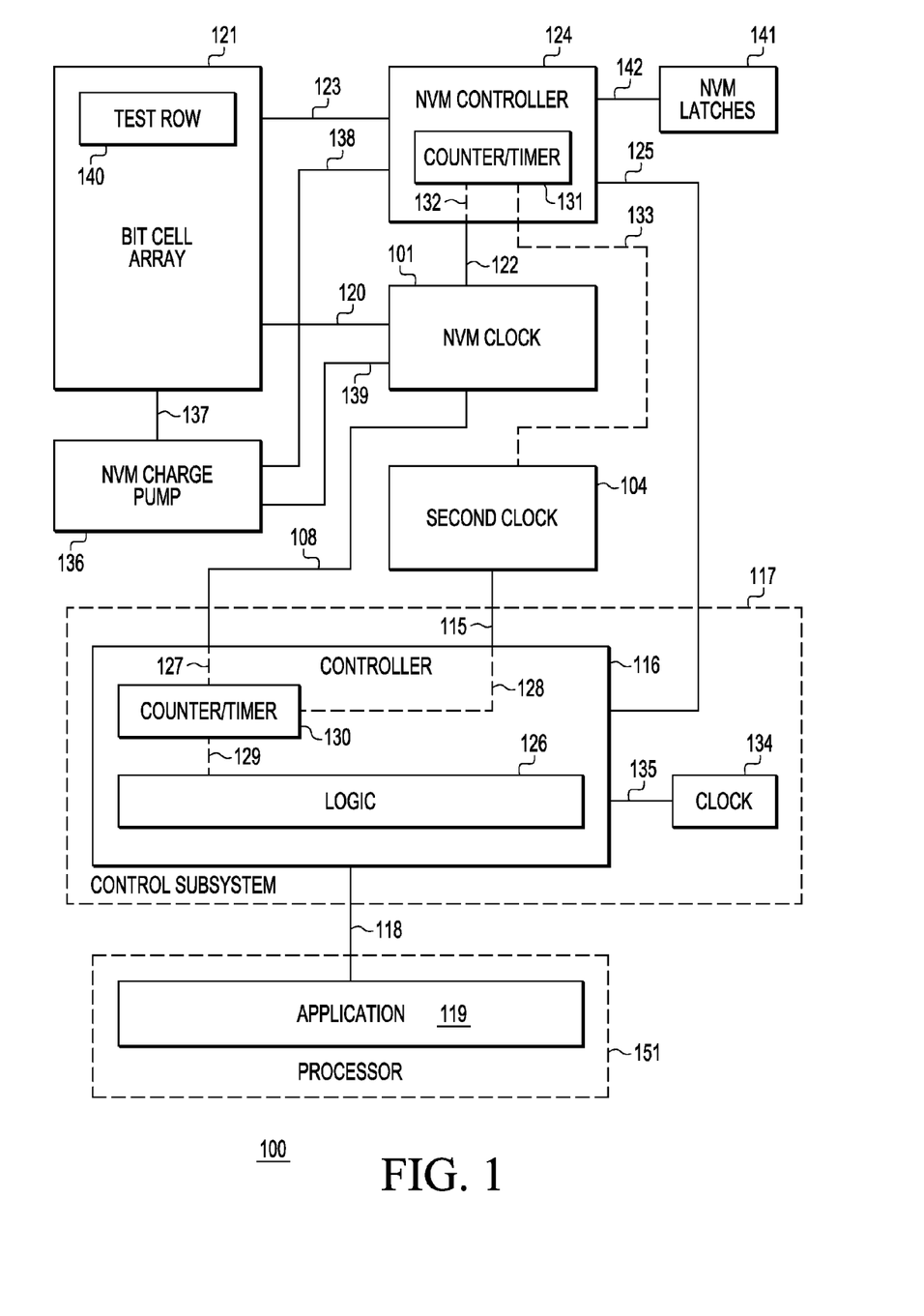
FIG. 1 is a block diagram illustrating NVM apparatus in accordance with at least one embodiment.

FIG. 1 is a block diagram illustrating NVM apparatus in accordance with at least one embodiment. The NVM apparatus 100 comprises NVM clock 101, second clock 104, controller 116, application 119, bit cell array 121, NVM charge pump 136, NVM latches 141, and non-volatile memory (NVM) controller 124. NVM clock 101 is connected via connection 120 to bit cell array 121. NVM clock 101 is connected via connection 139 to NVM charge pump 136. NVM clock 101 is connected via connection 122 to non-volatile memory (NVM) controller 124. NVM clock 101 is connected to controller 116 via connection 108. NVM charge pump 136 is connected to NVM bit cell array 121 via connection 137. NVM charge pump 136 is connected to NVM controller 124 via connection 138. Controller 116 is able to measure the rate of the NVM clock signal of NVM clock 101 as received via connection 108. In the case of multiple NVM clock signals, multiple instances of connection 108 may be implemented to allow controller 116 to be able to measure the rate of the multiple NVM clock signals. Bit cell array comprises test row 140, which may be used to store configuration information which can be used for configuration of the NVM. Bit cell array 121 is connected via connection 123 to NVM controller 124. NVM controller 124 may also be connected via connection 125 to controller 116. NVM latches 141 are connected to NVM controller 124 via connection 142.

In accordance with at least one embodiment, NVM controller 124 comprises counter/timer 131. Counter/timer 131 is connected via internal connection 132 to connection 122 to NVM clock 101. Counter/timer 131 is connected via connection 133 to second clock 104. Connection 133 allows counter/timer 131 to use second clock 104 as a reference clock to measure the NVM clock frequency of NVM clock 101.

A control subsystem 117 comprises controller 116 and clock 134. Controller 116 is connected to clock 134 via connection 135. A bus 115 connects second clock 104 to controller 116. In accordance with at least one embodiment, controller 116 comprises counter/timer 130 and logic 126. Logic 126 may, for example, be implemented as a finite state machine or, as another example, as firmware comprising logical operations, wherein the firmware may be executed on a processor, for example, controller 116, to perform at least one method. Counter/timer 130 may be connected to connection 108 via internal connection 127, allowing counter/timer 130 to measure the rate of a clock signal of NVM clock 101 as received from NVM clock 101 via connection 108 and internal connection 127. Counter/timer 130 may be connected to connection 115 via internal connection 128, allowing counter/timer 130 to utilize second clock 104 as its timing reference source, receiving a second clock signal from second clock 104 via connection 115 and internal connection 128. Counter/timer 130 may be connected to logic 126 via internal connection 129. In accordance with at least one embodiment, second clock 104 is integrated with controller 116 within control subsystem 117. Controller 116 is connected to application 119 via connection 118. Application 119 is instruction-based program code, executed on a processor, for providing functionality for an end user of a product comprising the NVM. The processor may, for example, be a general purpose processor or a special purpose processor. The processor may be integrated on the same semiconductor die as the NVM (e.g., in a system-on-chip (SOC)) or may be implemented as a separate device. In the embodiment illustrated in FIG. 1, processor 151 is the processor on which application 119 is executed. In accordance with at least one embodiment, access to NVM bit cell array 121 by application 119 may be controlled by logic 126 inhibiting execution of application 119 until measurement of the charge pump output indicates the NVM is ready to be accessed, for example by providing a signal to processor 151. As an example, the signal may cause processor 151 to inhibit execution of application 119 or, as another example, application 119 may be able to check the state of the signal and delay its own execution until the NVM is ready to be accessed.

NVM bit cell array 121 may be used to store data, including user data and configuration information. Test row 140 of NVM bit cell array 121 stores configuration information as to the configuration of the NVM. NVM controller 124 controls operation of the NVM. As an example, NVM controller 124 controls access to data stored in NVM bit cell array 121. NVM clock 101 provides clock signals for the NVM. As an example, NVM clock 101 provides a clock signal to control a controlled voltage provided by NVM charge pump 136. As an example, NVM clock 101 provides a clock signal to control access to data stored in NVM bit cell array 121. As an example, NVM clock 101 provides a clock signal to operate NVM controller 124. NVM charge pump 136 provides a controlled voltage to NVM bit cell array 121. Control subsystem 117 provides control functionality of the NVM within the system comprising the NVM. Controller 116 controls elements within the system comprising the NVM. Counter/timer 130 of controller 116 allows controller 116 to perform counting and timing operations. Logic 126 of controller 116 implements methods controller 116 uses to perform control operations. Clock 134 provides a clock signal to enable operation of controller 116. Application 119 implements functionality desired by a user of the system comprising the NVM.

In accordance with at least one embodiment, counter/timer 130 may be used to trim at least one operational parameter of NVM clock 101, for example, during a production test process, or, as another example, in the field, to allow recalibration of the NVM clock 101 to the second clock 104. Controller 116 may use counter/timer 130 to measure a frequency of an NVM clock signal of NVM clock 101 based on a frequency of second clock 104. Controller 116 may then adjust an operational parameter of NVM clock 101 to adjust the frequency of the NVM clock signal of NVM clock 101 to be within an acceptable range. Such adjustment may be performed with or without cooperation with additional equipment. For example, controller 116 may instruct a laser trimming device to trim a component value of at least one component within NVM clock 101 to achieve operation of NVM clock 101 such that the NVM clock frequency is within the acceptable range. As another example, controller 116 may write a value of a timing parameter relied upon by NVM clock 101 to establish its NVM clock frequency to a NVM location accessible by NVM clock 101, which may, for example, be within bit cell array 121 or, for example, within NVM clock 101.

Second clock 104 may, for example, be a reliable clock that comes from an "always on" domain. As an example, if a system-on-a-chip (SOC) keeps running but powers down other subsystems (e.g., NVM) to save power, a clock derived from the SOC may be reliable, as it comes from an "always on" domain. For example, to the extent clock oscillators may experience transient errors from being powered up and powered down, a clock that comes from an "always on" domain can be expected to be more reliable than a clock that comes from a domain that is subject to power cycling. In accordance with at least one embodiment, second clock 104 may be an independent clock, operating independently of NVM clock 101. In accordance with at least one embodiment, second clock 104 may be an asynchronous clock, operating asynchronously of NVM clock 101. In accordance with at least one embodiment, second clock 104 may be a reference clock, providing a reference by which NVM clock 101 may be measured.

Figure 2:
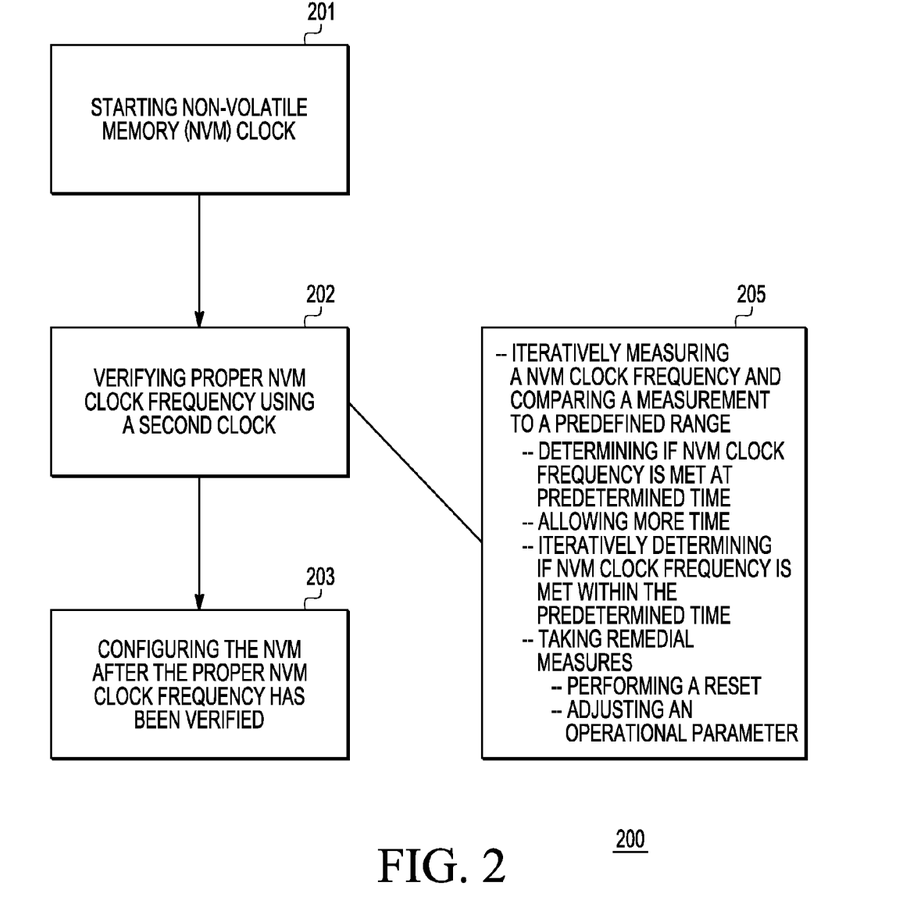
FIG. 2 is a flow diagram illustrating a method for start-up of an NVM using detection of clock edges of an NVM clock in accordance with at least one embodiment.

FIG. 2 is a flow diagram illustrating a method for start-up of an NVM using detection of clock edges of an NVM clock in accordance with at least one embodiment. Method 200 begins in block 201. In block 201, a non-volatile memory (NVM) clock is started. As an example, referring to FIG. 1, NVM clock 101 is started. As an example, referring to FIG. 1, controller 116 causes NVM clock 101 to be started. From block 201, the method continues to block 202.

In block 202, proper NVM clock frequency is verified using a second clock. As an example, the NVM clock frequency may be measured using a second clock. As another example, the NVM clock period may be measured using a second clock. As an example, referring to FIG. 1, controller 116 verifies the proper NVM clock frequency of a NVM clock signal of NVM clock 101 using second clock 104. As denoted by block 205, block 202 may comprise any number of features of block 205. For example, an iterative sub-process of measuring (e.g., counting) the NVM clock frequency of the NVM clock using the second clock and comparing the NVM clock frequency to a predefined range may be performed. As an example, referring to FIG. 1, controller 116 performs an iterative sub-process of counting the NVM clock frequency of a NVM clock signal of NVM clock 101 using second clock 104 and comparing the NVM clock frequency to a predefined range. As another example, in response to a maximum start-up time having been exceeded, the iteratively counting the NVM clock frequency may be discontinued and, instead, an error status message may be issued. The error status message may be issued, for example, to an SOC controller. As an example, referring to FIG. 1, in response to a maximum start-up time having been exceeded, controller 116 discontinues iteratively counting the NVM clock frequency of the NVM clock signal of NVM clock 101 and issues an error status message to application 119. As a further example, more time may be allowed for the NVM clock frequency to achieve a value within the predefined range. As an example, referring to FIG. 1, controller 116 allows more time for the NVM clock frequency of the NVM clock signal of NVM clock 101 to achieve a value within the predefined range. As yet another example, an operational parameter of the NVM clock may be iteratively adjusted. As an example, referring to FIG. 1, controller 116 iteratively adjusts an operational parameter of NVM clock 101.

If, in block 202, proper operation of NVM clock 101 is not verified, remedial measures may be undertaken. As an example, a reset operation may be performed. For example, referring to FIG. 1, controller 116 performs a reset operation, such as resetting a NVM clock, resetting a NVM charge pump, resetting the NVM as a whole (e.g., an entire product, for example, an entire vehicle, an entire consumer product, an entire industrial product, etc.), or resetting a SOC comprising the NVM. As an example, referring to FIG. 1, the reset operation may be performed on NVM clocks 101.

In accordance with at least one embodiment, the level of reset operation performed may be escalated iteratively. For example, a first reset operation may be performed at a low level (e.g., by resetting a NVM clock, a NVM charge pump, the like, or any combination thereof), a second reset operation may, if necessary, be performed at a higher level, and a subsequent reset operation may, if necessary, be performed at an even higher level (e.g., by resetting the system as a whole). In accordance with at least one embodiment, such iterative escalation of reset operations may be performed without issuing an error status message. In accordance with at least one embodiment, such iterative escalation of reset operations may be accompanied by error status messages, which may, for example, help minimize the disruption resulting from the increasing levels of reset operations. From block 202, the method continues to block 203.

In block 203, the method proceeds with configuration of the NVM after the proper NVM clock frequency has been verified. As an example, referring to FIG. 1, controller 116 proceeds with configuration of the NVM after the proper NVM clock frequency of the NVM clock signal of NVM clock 101 has been verified. As an example, referring to FIG. 1, NVM controller 124 proceeds with configuration of the NVM after the proper NVM clock frequency of the NVM clock signal of NVM clock 101 has been verified. As an example, referring to FIG. 1, application 119 proceeds with configuration of the NVM after the proper NVM clock frequency of the NVM clock signal of NVM clock 101 has been verified.

Figure 3:
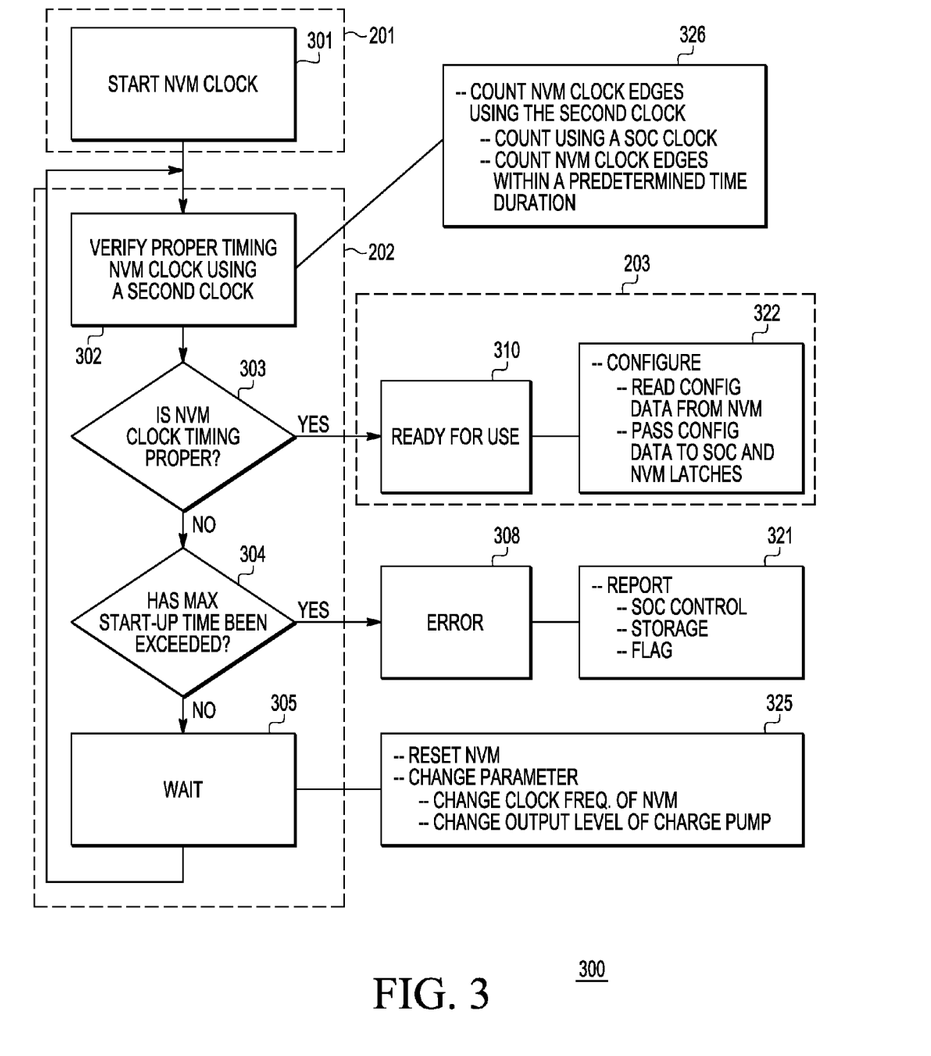
FIG. 3 is a flow diagram illustrating a method for start-up of an NVM using detection of clock edges of an NVM clock in accordance with at least one embodiment.

FIG. 3 is a flow diagram illustrating a method for start-up of an NVM using detection of clock edges of an NVM clock in accordance with at least one embodiment. Method 300 begins in block 301. In block 301, a non-volatile memory (NVM) clock for a NVM is started. As an example, referring to FIG. 1, NVM clock 101 is started. As an example, referring to FIG. 1, controller 116 starts NVM clock 101. Block 301 may be considered to be an implementation of block 201 of FIG. 2. From block 301, the method continues to block 302. The progression from block 301 to block 302 can occur with or without delay, wherein such a delay can be an indefinite delay, where operation of the system comprising the NVM may continue during the period of such delay. As an example, such delay may be of an amount of time expected to allow an NVM clock started in block 301 to be properly operating by the time proper timing of the NVM clock is verified in step 302.

In block 302, proper timing of a NVM clock is verified using a second clock. As an example, a count of NVM clock edges of the NVM clock is counted using a second clock as a reference. As an example, referring to FIG. 1, controller 116 uses counter/timer 130 to count a count of NVM clock edges of an NVM clock signal of NVM clock 101 using second clock 104 as a reference. As another example, the count of NVM clock edges of the NVM clock is counted using a system-on-a-chip (SOC) clock. As an example, referring to FIG. 1, the count of the NVM clock edges of the NVM clock 101 is counted using second clock 104. As yet another example, the count of the NVM clock edges of the NVM clock is counted within a predefined time duration based on a second clock. As an example, referring to FIG. 1, the count of the NVM clock edges of the NVM clock 101 is counted within a predefined time duration based on second clock 104. It will be appreciated such a second clock 104 may be located at various locations, such as: within the NVM device; within a system-on-a-chip (SOC); within a system-in-package (SIP), which may, for example, comprise multiple semiconductor chips stacked within a single integrated circuit (IC) package. It will be appreciated a counter/timer used to measure an NVM clock using a second clock 104 may be located at various locations, such as: within the NVM device; within a system-on-a-chip (SOC); within a system-in-package (SIP), which may, for example, comprise multiple semiconductor chips stacked within a single integrated circuit (IC) package. In an example where second clock 104 provides an internal second clock signal not accessible at the pins of the integrated circuit (IC) package containing the NVM charge pump, use of an on-board counter/timer can provide access to such internal voltage for measurement. From block 302, the method continues to decision block 303.

In decision block 303, a decision is made as to whether or not the NVM clock timing is proper. If the decision is made that the NVM clock timing is proper, the method continues to block 310, where the NVM is ready to use. As shown in block 322, block 310 may comprise any number of features of block 322. For example, configuration of the NVM may be performed on the NVM to make the NVM ready to use. As an example, configuration data may be read from the NVM, for example, from a test row of the NVM. As another example, the configuration data may be passed to a system-on-chip (SOC) controller and to NVM latches to make the NVM ready to use. As yet another example, in response to the count of NVM clock edges being within a predefined range, the NVM is deemed to be ready for use and access to the NVM is allowed. As an example, referring to FIG. 1, in response to the count of NVM clock edges of NVM clock 101 being within the predefined range, controller 116 allows application 119 to access the NVM. Blocks 310 and 322 may be considered to be an implementation of block 203 of FIG. 2. If, in decision block 303, the decision is made that the NVM clock timing is not proper, the method continues to decision block 304.

In decision block 304, a decision is made as to whether or not a maximum start-up time has been exceeded. If so, the method continues to block 308, where an error is indicated. As shown by block 321, block 308 may comprise any number of features of block 321. For example, the error may be reported. As an example, the error may be reported to a system-on-chip (SOC) controller. As another example, the error may be reported by storing a value indicative of the error. As yet another example, the error may be reported by setting a flag to indicate the error. If, in decision block 304, the decision is made that the maximum start-up time has not been exceeded, the method continues to block 305. As yet another example, in response to the maximum start-up time having been exceeded, an error status message is issued. As an example, referring to FIG. 1, in response to the maximum start-up time having been exceeded, controller 116 issues an error status message to application 119. As another example, the error status message is issued to a system-on-a-chip (SOC) controller.

In block 305, in response to the NVM clock timing not being proper (e.g., the count of NVM clock edges not being within a predefined range), more time is allowed for the count of NVM clock edges to be within the predefined range. As an example, referring to FIG. 1, in response to the count of the NVM clock edges not being within a predefined range, controller 116 allows more time, limited to a maximum start-up time, for the count of the NVM clock edges of the NVM clock signal of NVM clock 101 to be within the predefined range. As shown by block 325, block 305 may comprise any number of features of block 325. For example, a soft reset of the NVM may be performed. As an example, referring to FIG. 1, controller 116 performs a soft reset of the NVM. As another example, an operational parameter of the NVM clock may be changed. As an example, referring to FIG. 1, controller 116 changes an operational parameter of the NVM clock 101. Examples include changing a clock frequency of the NVM and changing the output level of the NVM charge pump. Blocks 302, 303, 304, and 305 may be considered to be an implementation of block 202 of FIG. 2. From block 305, the method returns to block 302.

Figure 4:
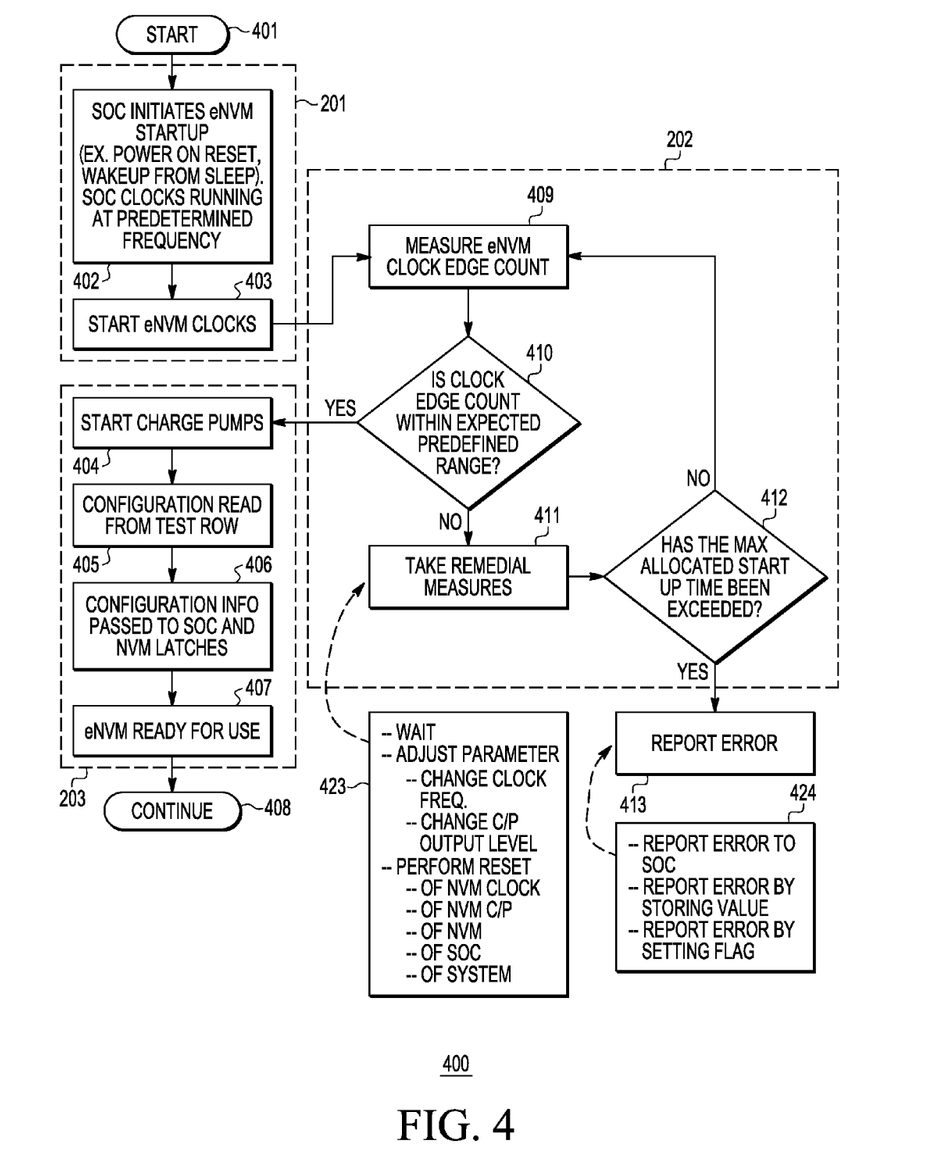
FIG. 4 is a flow diagram illustrating a method for start-up of an NVM using detection of clock edges of an NVM clock in accordance with at least one embodiment.

FIG. 4 is a flow diagram illustrating a method for start-up of an NVM using detection of clock edges of an NVM clock in accordance with at least one embodiment. Method 400 begins in block 401. From block 401, the method continues to block 402. In block 402, the system-on-a-chip (SOC) initiates non-volatile memory (NVM) start-up (e.g., power-on reset, wakeup from sleep, etc.) with the SOC clocks running. As an example, referring to FIG. 1, controller 116 initiates NVM start-up with the clock 134 running at a predetermined frequency. From block 402, the method continues to block 403.

In block 403, operation of the NVM clocks commences. As an example, referring to FIG. 1, operation of NVM clock 101 commences. As an example, referring to FIG. 1, controller 116 (or NVM controller 124) commences operation of NVM clock 101. Blocks 402 and 403 may be considered to be an implementation of block 201 of FIG. 2. From block 403, the method continues to block 409. In block 409, a controller measures a NVM clock edge count. As an example, referring to FIG. 1, controller 116 measures a NVM clock edge count of a NVM clock signal from NVM clock 101. From block 409, the method continues to decision block 410. In decision block 410, a decision is made as to whether or not the clock edge count is within an expected predefined range. As an example, referring to FIG. 1, controller 116 makes a determination as to whether or not the clock edge count, as counted by counter/timer 130, of a clock signal from NVM clock 101 is within the expected predefined range.

The expected predefined range may be selected in accordance with a particular implementation. Moreover, the expected predefined range may be based on an expected predefined NVM clock frequency. As examples, the intended predefined NVM clock frequency may be 4 megahertz (MHz), 10 MHz, 20 MHz, 40 MHz, or 60 MHz, although other embodiments may have other intended predefined NVM clock frequencies. While such intended predefined NVM clock frequencies may provide nominal values, actual NVM clock frequencies are expected to be within an expected predefined range, which may or may not be centered around the expected predefined NVM clock frequency. As an example, an expected predefined range may be within ±20% of an intended predefined NVM clock frequency. Thus, for example, if the intended predefined NVM clock frequency is 60 MHz, the expected predefined range may be 48 MHz to 72 MHz. As another example, the expected predefined range may be within ±10% of an intended predefined NVM clock frequency. Thus, for example, if the intended predefined NVM clock frequency is 60 MHz, the expected predefined range may be 54 MHz to 66 MHz. In other embodiments, the expected predefined range may be defined by other relationships to the intended predefined NVM clock frequency, for example, by absolute frequency differences, such as ±10 MHz from the intended predefined NVM clock frequency. In other embodiments, the expected predefined range may be defined as a range (e.g., a frequency range, a range of counts that provides a measurement within a frequency range, or the like), such as a frequency range having a predefined lower limit of 50 MHz and a predefined upper limit of 75 MHz or a range of edge counts describing such a frequency range.

If the clock edge count is not within the expected predefined range, the method continues to block 411, where remediation of the NVM clock's lack of readiness is provided. Examples of remedial measures of block 411 are shown in block 423. As an example, the NVM clock's lack of readiness may be accommodated by allowing the NVM clock more time to achieve readiness (e.g., for the NVM clock edge count to enter the expected predefined range). As an example, referring to FIG. 1, controller 116 allows NVM clock 101 more time to achieve readiness. As another example, a soft reset operation may be performed on the NVM to restart the NVM clock, which may bring the NVM clock edge count in compliance with the expected predefined range. As an example, referring to FIG. 1, controller 116 performs a soft reset operation on the NVM to restart the NVM clock 101. The type of reset performed may be varied or escalated, for example, by performing one or more of resetting NVM clock 101, resetting NVM charge pump 136, resetting the NVM as a whole, resetting the SoC as a whole, and resetting the system as a whole. As yet another example, an operational parameter of the NVM clock may be adjusted to increase the likelihood of the NVM clock achieving operation such that the NVM clock edge count is within the expected predefined range. As an example, referring to FIG. 1, controller 116 adjusts an operational parameter of the NVM clock 101, such as a bias current of the NVM clock, which may be increased or decreased, or a bias voltage of the NVM clock, which may increased or decreased. As examples, the clock frequency of NVM clock 101 may be adjusted or the charge pump output level of NVM charge pump 136 may be adjusted.

From block 411, the method continues to decision block 412, where a decision is made as to whether or not the maximum allocated start-up time has been exceeded. As an example, referring to FIG. 1, controller 116 determines whether or not the maximum allocated start-up time has been exceeded. If not, the method returns to block 409, where the NVM clock edge count is again measured. If so, the method continues to block 413, where a controller reports an error. Examples of error reporting of block 413 are illustrated in block 424. For example, the controller may send an error status message to a system-on-chip (SOC) controller. As an example, referring to FIG. 1, controller 116 sends an error status message to application 119. As another example, an error is reported by storing a value. As yet another example, an error is reported by setting a flag. Block 409, decision block 410, block 411, and decision block 412 may be considered to be an implementation of block 202 of FIG. 2.

If, in decision block 410, a decision was made that the NVM clock edge count is within the expected predefined range, the method continues to block 404. In block 404, operation of the NVM charge pumps commences. As an example, referring to FIG. 1, operation of NVM charge pump 136 commences. As an example, referring to FIG. 1, controller 116 causes operation of NVM charge pump 136 to commence. From block 404, the method continues to block 405.

In block 405, a configuration is read from a test row of the NVM. As an example, referring to FIG. 1, NVM controller 124 reads a configuration from a test row 140 of the NVM. From block 405, the method continues to block 406. In block 406, configuration information read in block 405 is passed to SOC and NVM latches. As an example, referring to FIG. 1, NVM controller 124 passes the configuration information read in block 405 to controller 116 and to NVM latches 141. From block 406, the method continues to block 407. In block 407, the NVM is determined to be ready for use. As an example, referring to FIG. 1, controller 116 determines the NVM to be ready for use. Blocks 404, 405, 406, and 407 may be considered to be an implementation of block 203 of FIG. 2. From block 407, the method continues to block 408. In block 408, the method continues, allowing an application to begin accessing the NVM. As an example, referring to FIG. 1, controller 116 allows application 119 to begin accessing the NVM.

It will be appreciated that the flow of FIG. 4 is representative of a particular method and that additional blocks can occur between the illustrated blocks. For example, the method may continue immediately from block 404 to block 409, or a delay may occur between block 403 and block 409. Such a delay may be based on an amount of time expected to allow a NVM clock started in block 403 to produce an output within an expected predefined range by the time the measurement of the NVM clock edge count is made in block 409.

Figure 5:
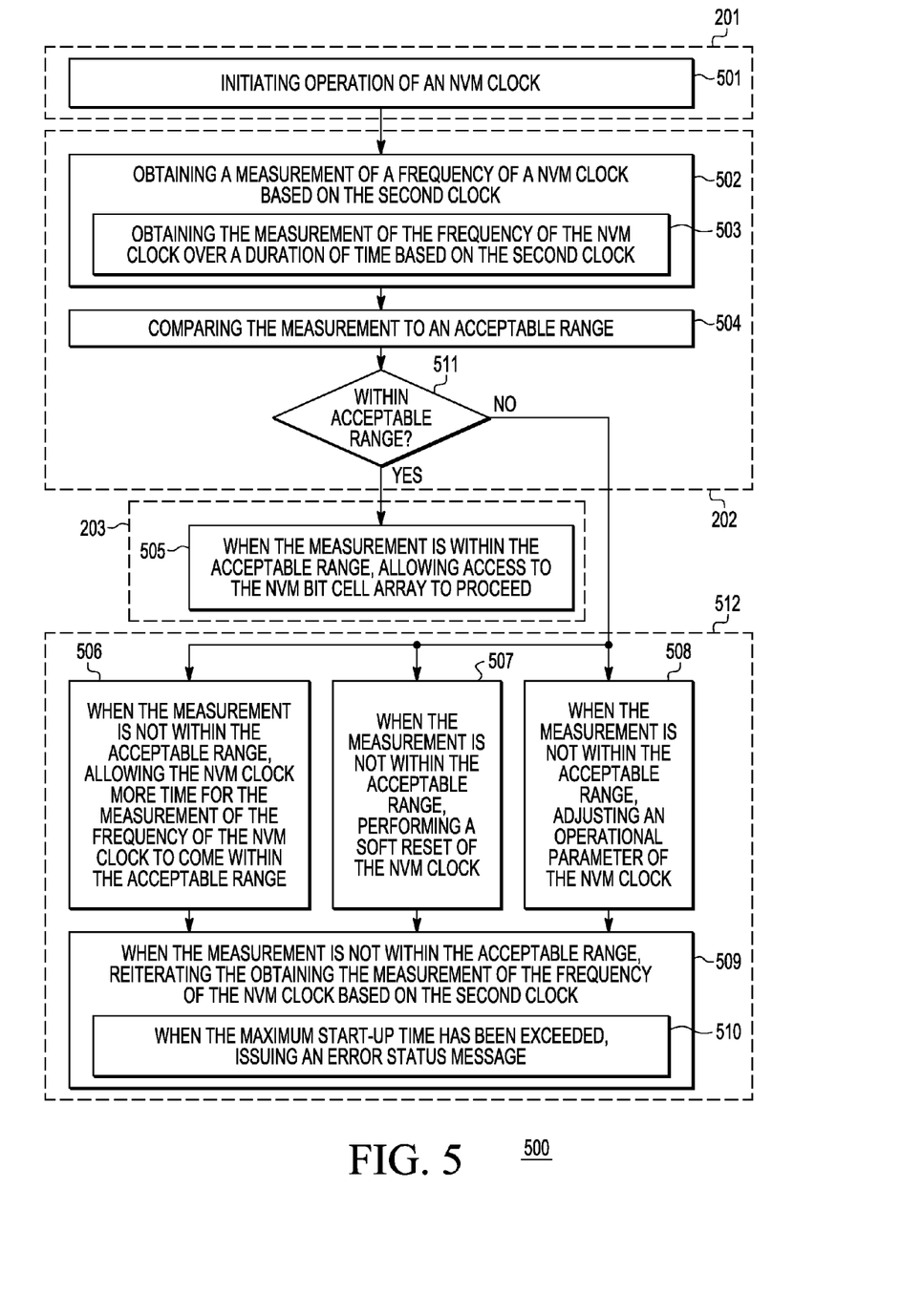
FIG. 5 is a flow diagram illustrating a method for start-up of an NVM using detection of clock edges of an NVM clock implemented in NVM apparatus in accordance with at least one embodiment.

FIG. 5 is a flow diagram illustrating a method for start-up of an NVM using detection of clock edges of an NVM clock implemented in NVM apparatus in accordance with at least one embodiment. Method 500 begins in block 501. In block 501, operation of a NVM clock is initiated. As an example, referring to FIG. 1, controller 116 initiates operation of NVM clock 101. Block 501 may be considered to be an implementation of block 201 of FIG. 2. From block 501, the method continues to block 502. In block 502, a count of the frequency of the NVM clock is obtained based on the second clock. As an example, controller 116 uses counter/timer 130 to obtain a count of the frequency of an NVM clock signal of NVM clock 101 based on second clock 104. Block 502 may comprise block 503. In block 503, the count of the frequency of the NVM clock is obtained over a duration of time based on the second clock. As an example, referring to FIG. 1, controller 116 obtains the count of the frequency of the NVM clock signal of the NVM clock 101 over a duration of time based on the second clock 104. From block 502, the method continues to block 504. In block 504, the count is compared to an acceptable range. As an example, referring to FIG. 1, controller 116 compares the count to an acceptable range.

From block 504, the method continues to decision block 511, where a decision is made as to whether or not the measurement is within the acceptable range. Block 502 (which may or may not include block 503), block 504, and decision block 511 may be considered to be an implementation of block 202 of FIG. 2. From decision block 511, the method continues to block 505 in response to the count being within the acceptable range or to at least one of block 506, block 507, and block 508 in response to the count not being within the acceptable range. In block 505, in response to the count being within the acceptable range, access to the NVM bit cell array is allowed to proceed. As an example, referring to FIG. 1, in response to the count being within the acceptable range, controller 116 allows access to the NVM bit cell array 121 by application 119 to proceed. Block 505 may be considered to be an implementation of block 203 of FIG. 2. In block 506, in response to the count not being within the acceptable range, the NVM clock is allowed more time for the count of the frequency of the NVM clock to come within the acceptable range. As an example, referring to FIG. 1, controller 116 allows more time for the count of the frequency of the NVM clock signal of the NVM clock 101 to come within the acceptable range. In block 507, in response to the count not being within the acceptable range, a soft reset of the NVM clock is performed. As an example, referring to FIG. 1, controller 116 can perform a soft reset of the NVM clock 101. In block 508, in response to the count not being within the acceptable range, an operational parameter of the NVM clock is adjusted. As an example, referring to FIG. 1, controller 116 can adjust an operational parameter of the NVM clock 101. From any of blocks 506, 507, or 508, the method continues to block 509. In block 509, in response to the count not being within the acceptable range, the obtaining the count of the frequency of the NVM clock based on the second clock is reiterated. As an example, referring to FIG. 1, in response to the count not being within the acceptable range, controller 116 reiterates the obtaining the count of the frequency of the NVM clock signal of the NVM clock 101 based on second clock 104. Block 509 may comprise block 510. In block 510, in response to a maximum start-up time having been exceeded, an error status message is issued. As an example, referring to FIG. 1, in response to a maximum start-up time having been exceeded, controller 116 issues an error status message to application 119. Blocks 506, 507, 508, and 509 (which may or may not include block 510) may be considered to be an implementation of a larger block 512 for responding to the measurement not being within the acceptable range.

In accordance with at least one embodiment, apparatus comprises a controller comprising logic to control the controller to perform at least one method. Such logic may comprise, for example, a state machine or firmware executable to perform operations, including logical operations, thereby allowing performance of the at least one method. The logic may control, for example, operation of an NVM module, including performance of a start-up sequence. Such apparatus also comprises a counter module. The counter module is connected to the controller, allowing the counter module to count events, such as a signal edge transitions, and to provide such counts to the controller. In accordance with at least one embodiment, the controller instructs the counter module to perform a count of the number of edges (e.g., rising edges, falling edges, or both rising and falling edges) of an NVM clock during the start-up sequence, wherein the count is performed with reference to a second clock independent of the NVM clock. The second clock is a clock whose performance (e.g., stability, accuracy, etc.) at the time the count is being made is expected to be reliable, such that counts outside of an acceptable range can be attributed to a problem with the NVM clock. Based on the count received by the controller from the counter module, the controller may allow the start-up sequence to continue, may provide more time for the count to achieve a value within an acceptable range (e.g., by restarting the counting process and comparing a new count to the acceptable range), may adjust a NVM clock operational parameter of the NVM clock to bring the NVM clock count to be within the acceptable range, or may issue an error status message indicating inability of the NVM clock to provide a frequency that results in a count within the acceptable range within an allowable time.

In accordance with at least one embodiment, measurement of a NVM clock frequency may be used to monitor a NVM clock during an initial start-up process, for example, preventing access to a NVM bit cell array until the NVM clock frequency is within an acceptable range. For example, any read, erase, or program operations on a NVM bit cell array may be prevented until the NVM clock frequency of the NVM clock is within an acceptable range. Measurement of a NVM clock frequency may be used to monitor a NVM clock on an ongoing basis during operation of a system comprising a NVM. For example, measurement of a NVM clock frequency may be used to monitor a NVM clock prior to a proposed erase operation or prior to a proposed program operation occurring during operation long after any initial start-up process.

While measurement of the NVM clock frequency is discussed in terms of counting a number of clock edges occurring within a duration of time, it should be understood that measurement of the NVM clock frequency may be accomplished in a variety of ways. As an example, a period of the NVM clock may be measured, and the inverse of the period determined to obtain the NVM clock frequency. As another example, the period of the NVM clock may be measured and used as a value representative of the NVM clock frequency without inverting the period. As another example, the NVM clock may be sampled and a Fourier transform (e.g., fast Fourier transform (FFT)) performed on the samples using digital signal processing (DSP) techniques to obtain the NVM clock frequency. As another example, a delay locked loop (DLL) may be implemented to provide an error signal as a function of a difference between a NVM clock and a second clock (e.g., a reference clock). As another example, the NVM clock may be used to drive a switched capacitor circuit. In accordance with at least one embodiment, the switched capacitor circuit may be connected to a current source. In accordance with at least one embodiment, a current through the switched capacitor circuit is measured to obtain a value representative of the NVM clock frequency. In accordance with at least one embodiment, a capacitor is connected to an output of the switched capacitor circuit. In accordance with at least one embodiment, the voltage of the capacitor connected to the output of the switched capacitor circuit is measured over time to obtain a value representative of the NVM clock frequency. In accordance with at least one embodiment, a time is measured until the capacitor connected to the output of the switched capacitor circuit reached a specified voltage. In accordance with at least one embodiment, a resistor is connected to an output of the switched capacitor circuit. In accordance with at least one embodiment, a comparator is used to compare a voltage obtained from the switched capacitor circuit to a reference voltage to qualify the NVM clock frequency. In accordance with at least one embodiment, an analog-to-digital converter (ADC) is connected to the output of the switched capacitor circuit to obtain a value representative of the NVM clock frequency. Accordingly, whether measured directly or indirectly, the NVM clock frequency is effectively measured by obtaining a quantification or a qualification based on the NVM clock frequency.

A variety of erroneous modes may be detected and corrected according to at least one embodiment. For example, if a NVM clock fails to start up properly (e.g., starts up at a harmonic, such as a third harmonic, of its intended operating frequency), it will be operating at an incorrect frequency, which will result in a number of clock transitions (e.g., rising edges, falling edges, or rising and falling edges), which can be detected by counting the number of clock transitions over a predetermined period using a counter referenced to an independent clock, such as a second clock. Since the NVM clock oscillator is designed to operate at its fundamental frequency, not at a harmonic of its fundamental frequency, harmonic operation cannot be sustained, so, after some time, the harmonic state ends, and the NVM clock oscillator returns to the fundamental state. Thus, by counting the NVM clock frequency, waiting for a count (e.g., a re-count, if necessary) of the NVM clock frequency to have a value within an acceptable range, and waiting for a time duration and counting the NVM clock frequency again (e.g., re-counting the NVM clock frequency) to determine the value to be within the acceptable range, proper operation of a NVM clock oscillator can be assured even after the NVM clock oscillator has begun operating in a harmonic state. Thus, it is possible to ensure that the charge pump is normal and operating properly before completing the start up/wake up sequence, and doing so can prevent failure of a customer application in a system comprising NVM. Assuring proper operation of a NVM subsystem is especially important for critical applications, such as automotive applications. Almost all automotive microcontrollers have built-in counter modules and have access to independent clock signals, which, in accordance with at least one embodiment, could be used to count the NVM clock frequency. Moreover, most modern microcontrollers include counter capability and versatile clock configuration capability, allowing at least one embodiment to be easily implemented for a wide variety of applications.

In accordance with at least one embodiment, instead of attempting to change a NVM clock operational parameter, such as precisely adjusting the NVM clock frequency, to attempt to achieve optimized NVM clock performance (with respect to reset, charge pump output, loads, etc.), a process of waiting for the NVM clock to operate properly (e.g., to transition from a harmonic state to the fundamental state), as verified by counting the NVM clock frequency with reference to an independent clock, allows proper NVM clock operation to be achieved simply and efficiently (e.g., ensuring that the NVM clock signal is stable and correct). Moreover, such an approach avoids unnecessary adjustment of a NVM operational parameter, which might frustrate the NVM's tendency to restore itself to proper operation without intervention. For example, if a NVM clock were to start up in a transient undesired harmonic state, resulting in an improper NVM clock frequency, an attempt to adjust a NVM clock operational parameter to obtain a proper NVM clock frequency may be futile if the NVM clock reverts to operation in its desired fundamental state, thereby necessitating further adjustment of the NVM clock operational parameter to restore the NVM clock frequency to the value it would have had but for the transient undesired harmonic state of the NVM clock. Also, an attempt to adjust another NVM operational parameter, such as the clock frequency of the NVM clock, may be futile if the NVM clock reverts to operation in its desired fundamental state, as the attempted adjustment might overcorrect for the problem, given the NVM clock's tendency to correct the problem itself without intervention. Therefore, the wait-and-measure iterations, in accordance with at least one embodiment, may provide better system performance than attempted adjustment of operational parameters.

In accordance with at least one embodiment, as opposed to precisely adjusting the NVM clock frequency to improve the desired performance, ensuring that the NVM clock frequency is within an acceptable range prior to usage of a NVM (i.e., prior to performing a memory operation accessing (e.g., reading, writing, or erasing) the NVM) can validate proper operation of the NVM in a decisive manner. Such decisive validation of NVM operation is capable of enabling zero-defect products for demanding applications (e.g., automotive applications). Such decisive validation provides a preventative method to ensure the NVM clock is robust prior to any operations, thereby avoiding failures and increasing reliability.

At least one embodiment may be implemented for a non-volatile memory (NVM) device. For example, at least one embodiment may be implemented for a flash memory device. At least one embodiment may be implemented for a floating gate memory device. As an example, at least one embodiment may be implemented for a non-volatile floating gate memory device. Examples of types of memory devices for which at least one embodiment may be implemented include flash memory devices, traditional electrically erasable programmable read-only memory (EEPROM) devices, ferroelectric random access memory (FeRAM), magnetoresistive random access memory (MRAM), programmable metallization cell (PMC) memory, and phase change memory (PCM).

Embodiments may be practiced with various memory technologies. For example, embodiments may be practiced with NOR flash memory or with NAND flash memory. Embodiments may be practiced with one-bit-per-cell (i.e., single-level cell (SLC)) and multiple-bit-per-cell (multiple-level cell (MLC)) memory technologies. Embodiments may be practiced with conductive (e.g., polycrystalline silicon) or non-conductive (e.g., silicon nitride ($Si_3N_4$) and metal nanocrystal) floating gate technologies. Embodiments may be practiced with memory devices using hot carrier injection or a quantum tunneling erasure mechanism.

In accordance with at least one embodiment, a method comprises starting a NVM clock for a non-volatile memory (NVM), counting a count of NVM clock edges of the NVM clock using a second clock, then, in response to the count of NVM clock edges not being within a predefined range, allowing more time, limited to a maximum start-up time, for the count of NVM clock edges to be within the predefined range, but, in response to the count of NVM clock edges being within a predefined range, deeming the NVM to be ready for use. In accordance with at least one embodiment, the counting the count of the NVM clock edges of the NVM clock using the second clock comprises counting the count of NVM clock edges of the NVM clock using a system-on-a-chip (SOC) clock. In accordance with at least one embodiment, the counting the count of the NVM clock edges of the NVM clock using the second clock comprises counting the count of the NVM clock edges of the NVM clock within a predefined time duration based on the second clock. In accordance with at least one embodiment, the, in response to the count of NVM clock edges not being within the predefined range, allowing more time, limited to the maximum start-up time, for the count of NVM clock edges to be within the predefined range comprises performing a soft reset of the NVM. In accordance with at least one embodiment, the, in response to the count of NVM clock edges not being within the predefined range, allowing more time, limited to the maximum start-up time, for the count of NVM clock edges to be within the predefined range comprises changing an operational parameter of the NVM clock. In accordance with at least one embodiment, the, in response to the count of NVM clock edges not being within the predefined range, allowing more time, limited to the maximum start-up time, for the count of NVM clock edges to be within the predefined range comprises, in response to the maximum start-up time having been exceeded, issuing an error status message. In accordance with at least one embodiment, the, in response to the maximum start-up time having been exceeded, issuing the error status message comprises issuing the error status message to a system-on-a-chip (SOC) controller.

In accordance with at least one embodiment, a method comprises starting a non-volatile memory (NVM) clock, verifying a proper NVM clock frequency using a second clock, and proceeding with configuration of the NVM after the proper NVM clock frequency has been verified. In accordance with at least one embodiment, the verifying the proper NVM clock frequency using the second clock comprises iteratively counting a NVM clock frequency of the NVM clock using the second clock and comparing the NVM clock frequency to a predefined range. In accordance with at least one embodiment, the iteratively counting the NVM clock frequency of the NVM clock using the second clock and comparing the NVM clock frequency to the predefined range comprises, in response to a maximum start-up time having been exceeded, discontinuing the iteratively counting the NVM clock frequency and instead issuing an error status message. In accordance with at least one embodiment, the, in response to the maximum start-up time having been exceeded, the discontinuing the iteratively counting the NVM clock frequency and instead issuing the error status message comprises in response to the maximum start-up time having been exceeded, discontinuing the iteratively counting the NVM clock frequency and instead issuing the error status message to a system-on-a-chip (SOC) controller. In accordance with at least one embodiment, the iteratively counting a NVM clock frequency of the NVM clock using the second clock and comparing the NVM clock frequency to a predefined range comprises allowing more time for the NVM clock frequency to achieve a value within the predefined range. In accordance with at least one embodiment, the iteratively counting a NVM clock frequency of the NVM clock using the second clock and comparing the NVM clock frequency to a predefined range comprises iteratively adjusting an operational parameter of the NVM clock.

In accordance with at least one embodiment, apparatus comprises a non-volatile memory (NVM) bit cell array, a NVM clock, the NVM clock providing timing for accessing the NVM bit cell array, a second clock, and a controller, the controller connected to the second clock and to the NVM clock, the controller comprising logic configured to cause the controller to perform a method comprising initiating operation of the NVM clock, obtaining a count of a frequency of a NVM clock based on the second clock, comparing the count to an acceptable range, and, in response to the count being within the acceptable range, allowing access to the NVM bit cell array to proceed. In accordance with at least one embodiment, the method further comprises, in response to the count not being within the acceptable range, reiterating the obtaining the count of the frequency of the NVM clock based on the second clock. In accordance with at least one embodiment, the method further comprises, in response to the count not being within the acceptable range, allowing the NVM clock more time for the count of the frequency of the NVM clock to come within the acceptable range. In accordance with at least one embodiment, the method further comprises, in response to the count not being within the acceptable range, performing a soft reset of the NVM clock. In accordance with at least one embodiment, the method further comprises, in response to the count not being within the acceptable range, adjusting an operational parameter of the NVM clock. In accordance with at least one embodiment, the obtaining a count of a frequency of a NVM clock based on the second clock comprises obtaining a count of a frequency of a NVM clock over a duration of time based on the second clock. In accordance with at least one embodiment, the, in response to the count not being within the acceptable range, reiterating the obtaining the count of the frequency of the NVM clock based on the second clock comprises, in response to a maximum start-up time having been exceeded, issuing an error status message.

What is claimed is:
1. A method comprising:

starting a memory clock for a memory array, wherein the memory clock provides a clock signal to control access to data stored in the memory array;

counting a count of memory clock edges of the clock signal of the memory clock using a second clock; and allowing access to the memory array in response to the count of the memory clock edges being within a predefined range.

2. The method of claim 1 wherein the counting the count of the memory clock edges of the memory clock using the second clock comprises:

counting the count of memory clock edges of the clock signal of the memory clock using a system-on-a-chip (SOC) clock.

3. The method of claim 1 wherein the counting the count of the memory clock edges of the clock signal of the memory clock using the second clock comprises:

counting the count of the memory clock edges of the clock signal of the memory clock within a predefined time duration based on the second clock.

4. The method of claim 1 further comprising:

in response to the count of memory clock edges not being within a predefined range, allowing more time for the count of memory clock edges to be within the predefined range.

5. The method of claim 4 wherein the, in response to the count of memory clock edges not being within the predefined range, allowing more time for the count of memory clock edges to be within the predefined range comprises:

changing an operational parameter of the memory clock.

6. The method of claim 4 wherein the allowing more time comprises:

restarting the memory clock.

7. The method of claim 1 further comprising:

in response to a maximum start-up time having been exceeded, issuing an error status message.

8. The method of claim 1 wherein the allowing access to the memory array in response to the count of the memory clock edges being within the predefined range comprises:

using the memory clock to perform a read operation on the memory array, wherein the memory array is a nonvolatile memory (NVM) array.

9. A method comprising:

starting a non-volatile memory (NVM) clock, wherein proper operation of an NVM is conditioned upon a proper NVM clock frequency of a clock signal of the NVM clock, wherein the clock signal is to control access to data stored in the NVM;

verifying the proper NVM clock frequency using a second clock; and proceeding with configuration of the NVM after the proper NVM clock frequency has been verified.

10. The method of claim 9 wherein the verifying the proper NVM clock frequency using the second clock comprises:

iteratively counting a NVM clock frequency of the NVM clock using the second clock and comparing the NVM clock frequency to a predefined range.

11. The method of claim 10 wherein the iteratively counting the NVM clock frequency of the NVM clock using the second clock and comparing the NVM clock frequency to the predefined range comprises:

in response to a maximum start-up time having been exceeded, discontinuing the iteratively counting the NVM clock frequency and issuing an error status message.

12. The method of claim 9 further comprising:

in response to lack of verification of the proper NVM clock frequency, allowing more time for the NVM clock frequency to achieve a value within the predefined range.

13. The method of claim 9 further comprising:

in response to lack of verification of the proper NVM clock frequency, iteratively adjusting an operational parameter of the NVM clock.

14. Apparatus comprising:

a non-volatile memory (NVM) cell array;

a NVM clock, the NVM clock coupled to the NVM cell array, the NVM clock providing timing for accessing the NVM cell array;

a second clock; and a controller, the controller coupled to the NVM cell array, to the second clock, and to the NVM clock, the controller comprising circuitry configured to cause the controller to initiate operation of the NVM clock, to obtain a count of a frequency of a NVM clock based on the second clock, to compare the count to an acceptable range, and, in response to the count being within the acceptable range, to allow access to the NVM cell array to proceed.

15. The apparatus of claim 14 wherein the circuitry further comprises:

circuitry configured to cause the controller to reiterate the obtaining the count of the frequency of the NVM clock based on the second clock in response to the count not being within the acceptable range.

16. The apparatus of claim 15 wherein the circuitry further comprises:

circuitry configured to cause the controller to allow the NVM clock more time for the count of the frequency of the NVM clock to come within the acceptable range in response to the count not being within the acceptable range.

17. The apparatus of claim 15 wherein the circuitry further comprises:

circuitry configured to cause the controller to restart the NVM clock in response to the count not being within the acceptable range.

18. The apparatus of claim 15 wherein the circuitry further comprises:

circuitry configured to cause the controller to adjust an operational parameter of the NVM clock in response to the count not being within the acceptable range.

19. The apparatus of claim 14 wherein the circuitry further comprises:

circuitry configured to cause the controller to obtain the count of a frequency of the NVM clock by counting NVM clock edges of the NVM clock over a duration of time based on the second clock.

20. The apparatus of claim 15 wherein the, in response to the count not being within the acceptable range, the circuitry configured to cause the controller to reiterate the obtaining the count of the frequency of the NVM clock based on the second clock comprises:

circuitry configured to cause the controller to issue an error status message in response to a maximum start-up time having been exceeded.

* * * * *